United States Patent [19]
Watanabe

[11] Patent Number: 5,616,949
[45] Date of Patent: Apr. 1, 1997

[54] SOLID-STATE IMAGE SENSING DEVICE

[75] Inventor: Zensaku Watanabe, Yokohama, Japan

[73] Assignee: Kabushiki Kaisha Toshiba, Kanagawa-ken, Japan

[21] Appl. No.: 224,373

[22] Filed: Apr. 7, 1994

[30] Foreign Application Priority Data

Apr. 9, 1993 [JP] Japan .................................. 5-82281

[51] Int. Cl.$^6$ ..................... H01L 31/0203; H01L 23/02
[52] U.S. Cl. ............................................ 257/434; 257/680
[58] Field of Search ................................. 257/434, 680

[56] References Cited

U.S. PATENT DOCUMENTS

| | | | |
|---|---|---|---|
| 3,639,675 | 2/1972 | Kaino | 257/709 |
| 5,270,491 | 12/1993 | Carnll, Jr. et al. | 257/678 |

FOREIGN PATENT DOCUMENTS 1-173639A 7/1989 Japan .

*Primary Examiner*—Sara W. Crane
*Assistant Examiner*—David Ostrowski
*Attorney, Agent, or Firm*—Finnegan, Henderson, Farabow, Garrett & Dunner, L.L.P.

[57] ABSTRACT

A solid-state image sensing device includes an image sensing element and a light transmissive plate provided over the element. The plate contains borosilicate glass and the dose of radioactive β rays emitted therefrom is small. The plate further contains potassium-based oxide the content of which is 0.1 or less in Wt %. The plate is provided with, at least, one non-reflective film attached to a surface thereof, the surface facing a light-receiving surface of the element. By means of the film, the β rays emitted from the plate further becomes small.

5 Claims, 2 Drawing Sheets

SOLID-STATE IMAGE SENSING DEVICE

BACKGROUND OF THE INVENTION

1. Field of the Invention

The present invention relates to a solid-state image sensing device, and more specifically to an improvement of a casing for housing a solid-state image sensing element.

2. Description of the Prior Art

Recently, the solid-state image sensing device is used widely in various fields. Conventionally, as shown in FIG. 1, a solid-state image sensing element (charge coupled element) 3 is mounted in a casing 2 formed with a hollow portion 1, and an opening surface 7 of the hollow portion 1 is covered with a light transmissive cap 6 formed by a light transmissive plate both surfaces of which are covered with non-reflective films 4a and 4b.

In more detail, the casing 2 formed of ceramic, for instance is formed with the hollow portion 1. In the side wall of the hollow portion 1 of the casing 2, a bottom portion 8, a first stepped portion 9, a second stepped portion 12, and a third stepped portion 13 are formed stepwise. The solid-state image sensing element 3 is mounted on the bottom portion 8. Further, an electrode of the solid-state image sensing element is connected to the first stepped portion 9 formed in the casing 2 via a metallic fine wire 10. That is, a conductive pattern (not shown) is formed in the first stepped portion 9 and the bottom portion 8 and then connected to an external electronic apparatus. Further, in the case where the fine wire 10 is grounded, the conductive pattern is not formed at the bottom portion 8 of the casing 2.

Further, a light shading plate 11 is mounted at the second stepped portion 12, and the light transmissive cap 6 is fixed to the casing 2 by applying an adhesive agent 14 onto the third stepped portion 13.

The non-reflective film 4a formed on the outer surface of the light transmissive plate 5 serves to prevent light allowed to be incident thereupon from being reflected and further to control the light entering the solid-state image sensing element 3. On the other hand, the non-reflective film 4b formed on the inner surface of the light transmissive plate 5 serves to prevent light from being reflected irregularly from the surface of the solid-state image sensing element 3 and the metallic fine wire 10 so that unnecessary light is prevented from entering the solidstate image sensing element 3.

However, the inventor of the present invention has found that there exists a problem in that charge is induced in the sensing element 3 by radioactive rays (β rays) emitted from the non-reflected film, in particular the nonreflective film 4b formed on the inner surface of the light transmissive plate 5, in spite of the fact that no light is allowed to be incident upon the image sensing element 3, with the result that the characteristics of the image sensing element 3 is deteriorated (referred to as a white defect, hereinafter) and thereby the reliability of the image sensing device is degraded.

The inventor has further found that the generation of the white defect depends on the quantity of potassium-based oxide which is a material of the light transmissive plate 5.

These correlations are quite different from the conventional theory with respect to the mechanism of white defect generation due to crystal defects produced in the semiconductor wafer. In the semiconductor devices such as EPROM, although software error caused by radioactive rays (α rays, in particular) is well known, however, the correlation between the solid-state image sensing element and the radioactive rays (β rays, in particular) has not been so far reported.

SUMMARY OF THE INVENTION

With these problems in mind, therefore, it is the object of the present invention to provide a semiconductor device having a film including a low radioactive material provided over a semiconductor element and, in particular a solid-state image sensing device, which can suppress the dose of radioactive rays emitted from the light transmissive cap to the solid-state image sensing element and therefore which is excellent in the characteristics and high in reliability.

To achieve the above-mentioned object, the present invention provides a semiconductor device comprising:

a semiconductor element; and a film containing borosilicate glass and provided over the semiconductor element.

The film further contains potassium-based oxide the content of which is 0.1 or less in Wt %.

Further, the present invention provides a solid-state image sensing device, comprising:

an image sensing element; and a light transmissive plate containing borosilicate glass and provided over the image sensing element.

The light transmissive plate further contains potassium-based oxide the content of which is 0.1 or less in Wt %.

The light transmissive plate is provided with, at least, one non-reflective film attached to a surface of the light transmissive plate, the surface facing a light-receiving surface of the image sensing element.

The non-reflective film is a single layer or multilayer formed of a material selected from the group consisting of alumina, zirconia, tantalum oxide and magnesium fluoride.

DETAILED DESCRIPTION OF THE PREFERRED EMBODIMENTS

Figure 1:
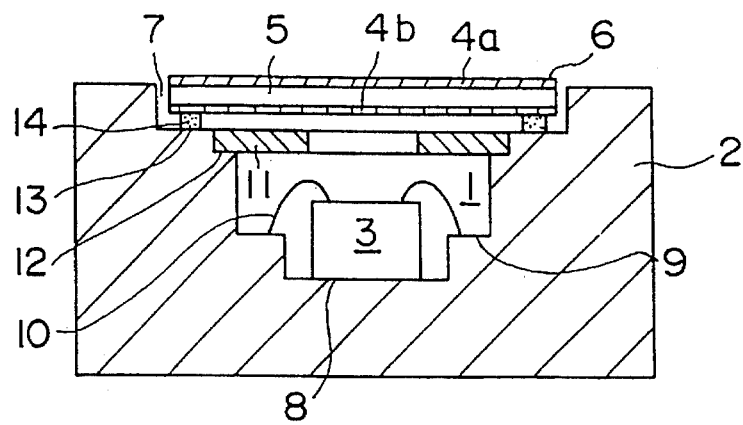
FIG. 1 is a cross-sectional view showing an essential portion of a conventional solid-state image sensing device.
Figure 2:
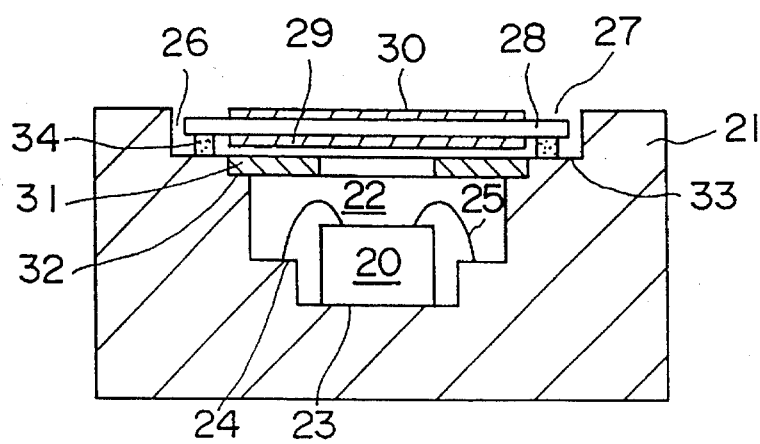
FIG. 2 is a cross-sectional view showing an essential portion of an embodiment of the solid-state image sensing device according to the present invention.

Embodiments of the present invention will be described hereinbelow with reference to FIGS. 2 to 5 and Table 1. As depicted in FIG. 2, a casing 21 formed of ceramic, for instance, for mounting a solid-state image sensing element 20 is formed with a hollow portion 22 having an opening surface. In the inner side wall of the hollow portion 22 of the casing 21, there are a bottom portion 23 and a first stepped portion 24, a second stepped portion 32, and a third stepped portion 33, formed stepwise.

The solid-state image sensing element 20 is mounted on the bottom portion 23 in the hollow portion 22 with an adhesive agent (not shown). Further, an electrode of the image sensing element 20 is connected to the first stepped portion 24 via a metallic fine wire 25. Therefore, a conductive pattern (not shown) is formed in the first stepped portion 24 and the bottom portion 23. Further, the fine wire 10 is led out of the casing 21, and then connected to an external electronic apparatus. Further, in the case where the fine wire is grounded, the conductive pattern is not formed in the bottom portion 23 of the casing 21.

Further, a light transmissive cap 27 is fixed so as to cover the opening surface 26 of the hollow portion 22 for protection of the image sensing element 20. The light transmissive cap 27 is composed of a light transmissive plate 28 made of optical glass, and two non-reflective films 29 and 30 formed on both surfaces of the light transmissive plate 28. In order to prevent unnecessary light from passing through the films, the non-reflective films are of a single layer or multilayer formed of material selected from the group consisting of alumina ($Al_2O_3$), zirconia ($ZrO_2$), tantalum oxide ($Ta_2O_5$) and magnesium fluoride ($MgF_2$) with a purity on the order of about three nines (0.999) to four nines (0.9999). In the case of the multilayer, the above-mentioned substances are formed in the order as described above. Further, in the non-reflective film formed of the above-mentioned substances, since the dose of the radioactive rays differ according to the places of origin, substances of less dose must be selected. The non-reflective films 29 and 30 are formed on both the surfaces of the light transmissive plate 28 in a dimension (diameter) larger than that of the solid-state image sensing element 20 in order to prevent light reflected from the metallic fine wire 25 more effectively.

Further, a light shading plate 31 is interposed between the non-reflective film 29 and the solid-state image sensing element 20 by applying an adhesive agent onto the second stepped portion 32 formed on the side wall of the hollow portion 22. Or else, the light shading plate 31 is simply mounted on the second stepped portion 32.

The light transmissive cap 27 prepared as described above is fixed to the third stepped portion 33 formed on the side wall of the hollow portion 22 with the use of an adhesive agent 34, thus the solid-state image sensing device can be completed.

In the same way as with the case of the conventional solid-state image sensing device, although the surfaces of the light transmissive plate are coated with the non-reflective films to prevent unnecessary reflective light from entering the image sensing element, the light transmissive plate is taken into account so that the β rays in particular transmitted from the light transmissive plate can be reduced. In more detail, since the light transmissive plate is manufactured on the basis of a raw material through a great number of steps, β rays are emitted from the light transmissive plate (glass).

However, owing to the present invention, it is possible to controllably reduce the dose of the β rays by suppressing the contents of the potassiumbased oxide in the light transmissive plate less than 0.1 Wt %, and thereby to reduce the white defect generation rate.

In practice, the inner surface of the light transmissive plate is covered with a non-reflective film for prevention of irregular reflective light from the metallic fine wire and form the outside from entering the image sensing element. The diameter of the light transmissive plate is determined to be larger than that of the image sensing element.

To prevent the irregular reflective light, the non-reflective films is of a single layer or a multilayer formed of material selected from of the group consisting of alumina ($Al_2O_3$), zirconia ($ZrO_2$), tantalum oxide ($Ta_2O_5$) and magnesium fluoride ($MgF_2$) with a purity on the order of about three nines (0.999) to four nines (0.9999). However, the α rays is still emitted by the non-reflective films.

Figure 3:
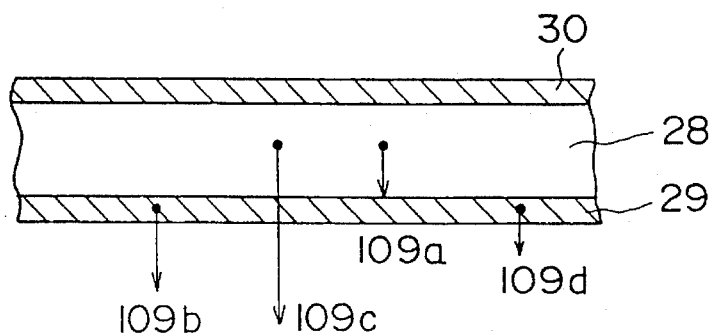
FIG. 3 is an illustration for assistance in explaining the radioactive ray emission in the solid-state image sensing device shown in FIG. 2.

FIG. 3 shows radioactive rays emitted from the light transmissive plate 28 and the non-reflective films 29 and 30, respectively, in which α rays emitted from the light transmissive plate 28 is denoted by 109a; α rays emitted from the non-reflective films 29 and 30 are denoted by 109b; β rays emitted from the from the light transmissive plate 28 is denoted by 109c; and β rays emitted from the non-reflective films 29 and 30 are denoted by 109d, respectively.

Figure 4:
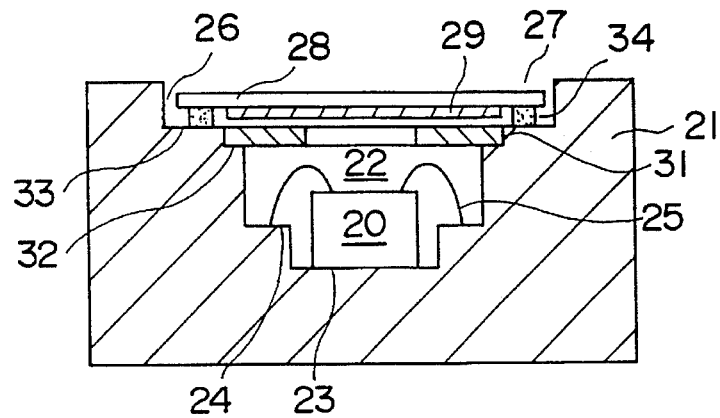
FIG. 4 is a cross-sectional view showing an essential portion of another embodiment of the solid-state image sensing device according to the present invention.

Further, FIG. 4 shows an example in which the non-reflective film 29 is formed only on an inner surface of the light transmissive plate 28 on the side of the image sensing element 20.

Table 1 lists the relationship in radioactive doses between the light transmissive plate 28 and the non-reflective films 29, 30 (which constitute the light transmissive cap 27), in addition to the white defect generation rate $T_f$ and the normalized value which indicates a numerical value obtained by dividing the white defect (defective) output value by a reference (standard) output value of a non-defective product.

TABLE 1

| SAMP | PLATE 28 | | | FILM 28, 30 | | | NOR |
|---|---|---|---|---|---|---|---|
| No. | GLSS | DOSE | Kwt % | FILM | DOSE | $T_f$ | VAL |
| REF 1 | 1 | A | L | 2 | — | — | 0.56 | 3.20 |
| REF 2 | 2 | A | L | 2 | E | L | 0.4 | 3.00 |
| EX-1 | 3 | B | M | <0.1 | — | — | 0.15 | 1.64 |
| EX-2 | 4 | B | M | <0.1 | F | S | 0.07 | 1.16 |
| REF 3 | 5 | C | M | 8 | — | — | 0.32 | 1.36 |
| REF 4 | 6 | C | M | 8 | F | S | 0.13 | 1.64 |
| REF 5 | 7 | D | S | >8 | — | — | 0.28 | 1.20 |

In Table 1, Sample Nos. 1 and 2 (REFS 1 and 2) are conventional examples, Sample Nos. 3 and 4 (EX-1 and -2) are embodiments of the present invention and Sample Nos. 5, 6 and 7 (REFS 3, 4 and 5) are samples produced for comparison.

Table 1 lists data of Sample Nos. 1 to 7. In the light transmissive plate 28, A, B, C and D denote the sorts of the glass material selected as the light transmissive plate 28. A of the Sample Nos. 1 and 2 denotes glass formed of the main material of $SiO_2+B_2O_3+Al_2O_3$ base; B of the sample Nos. 3 and 4 denotes glass formed of the main material of $SiO_2+B_2O_3+Na_2O$ base (borosilicate glass); C of the sample Nos. 5 and 6 denotes glass formed of the main material of $SiO_2+B_2O_3+K_2O$ base; and D of the sample No. 7 denotes glass formed of the main material of $SiO_2+B_2O_3+K_2CO_3+KNO_3$ base, respectively. Further, the K (potassium)-based oxide is 2 Wt % in the case of A; 0.1 Wt % or less in the case of B (the present invention); about 8 Wt % in the case of C; and 8 Wt % or more in the case of D.

Further, in the non-reflective films 29 and 30, E denotes the raw material ($ZrO_2$) having an α ray (in particular) dose of 0.01 (count/min. $cm^2$) or more; and F of the present invention denotes the raw material having an α ray (in particular) dose of about 0.001 (count/min. $cm_2$). Further, L (large), M (medium) and S (small) denote dose rate, respectively. Here, (L) denotes a large dose of about 0.008 (count/min. $cm^2$), (M) denotes a medium dose of about 0.0015 (count/min. $cm^2$); and (S) denotes a medium dose of about 0.001 (count/min. $cm^2$), respectively when measured by a radioactive ray measuring instrument (silicon surface barrier type detector).

Figure 5:
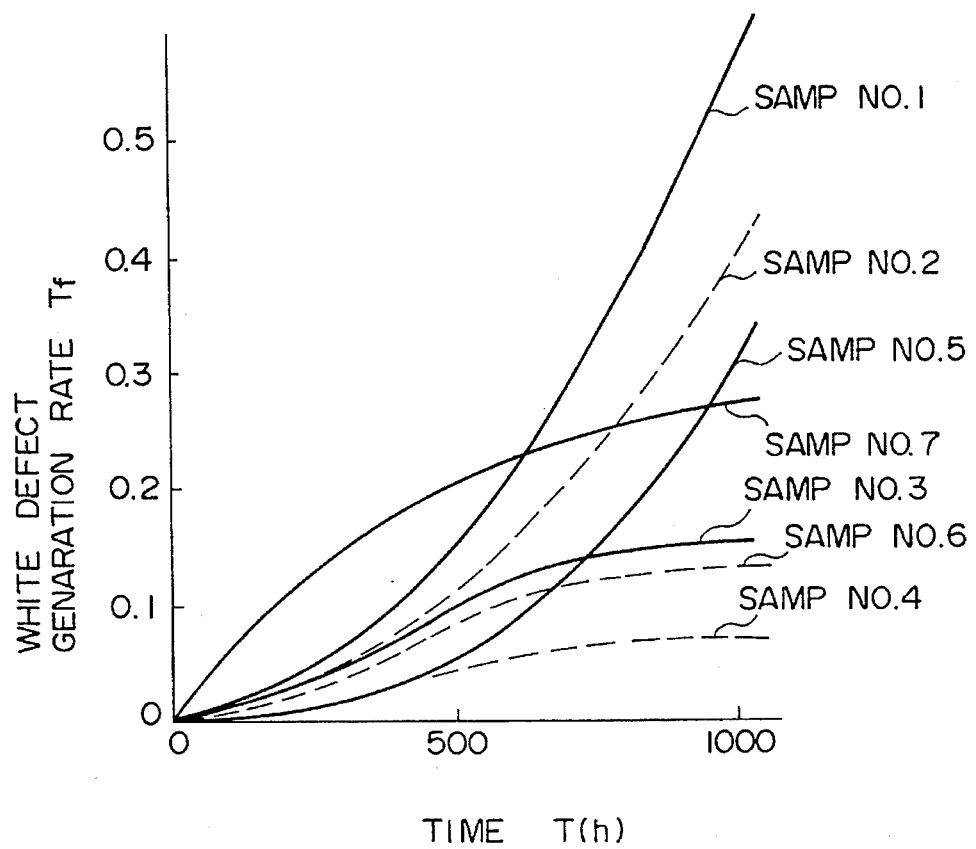
FIG. 5 is a graphical representation showing the characteristics of the solid-state image sensing device according to the present invention.

Further, FIG. 5 shows the relationship between the respective white defect generation rate $T_f$ per product (the ordinate) and the lapse of time (the abscissa).

In Table 1, the normalized value indicates a numerical value obtained by dividing the white defect (defective) output value by a reference (standard) output value of a non-defective product. Therefore, this normalized value is a numerical value indicative of a size of the white defect. Further, the white defect generation rate $T_f$ is the number of white defects generated per each solid-state image sensing element 20.

In more detail, the white defects are examined as follows: the solid-state image sensing elements 20 of 400,000 pixels are arranged along scanning lines on a monitor (a Braun tube) (800 pixels in a row and 500 pixels in a column) and activated. In this state, the white defects found at the respective central points of the pixels are counted. When an oscilloscope is connected to the monitor, since the white defects can be displayed electrically, it is possible to check the white defect generation rate $T_f$ and the normalized value, respectively. In practice, the white defects can be checked automatically all over the monitor picture with the use of an automatic inspecting instrument. These white defects are produced when a charge is induced at the respective pixels.

The respective sample Nos. will be described in further detail hereinbelow. As described above, in the case of the sample No. 1, the light transmissive plate 28 is formed of an optical glass A manufactured by processing an raw material through a long manufacturing process. The a ray dose emitted by this light transmissive plate 28 is relatively large dose (L) and the contents of the potassium-based oxide is relatively large as 2 Wt %.

In this sample No. 1, the white defect generation rate $T_f$ is as high as 0.56 (the number of white defects/image sensing element 20) after 1000 H has elapsed, and the normalized value is 3.20.

In the case of the sample No. 2, the non-reflective plates 29 and 30 are formed by depositing film substance on the light transmissive plate 28 by vacuum evaporation. The α ray dose of this film substance is as high as about 0.01 (count/min $cm^2$) in the raw material.

In this sample No. 2, the white defect generation rate $T_f$ is as high as 0.40 (the number of white defects/image sensing element20) after 1000 H has elapsed, and the normalized value is as high as 3.00.

Here, the reason why the white defect generation rate $T_f$ of the sample No. 1 is higher than that of the sample No. 2 can be considered as follows: the light transmissive plate 28 emits α rays (109a of FIG. 3) of an extremely small transmissibility (which can be shaded by a single copying paper) and β rays (109c of FIG. 3) of a relatively high transmissibility. In the case of the sample No. 2, since the radioactive rays for causing white defects are absorbed by the non-reflective films 29 and 30, that is, since a part of the β rays (109c) can be absorbed, it is assumed that the dose of radioactive rays (including β rays) emitted by the light transmissive cap 27 can be reduced through the light transmissive plate 28 formed with two non-reflective films.

In the case of the sample Nos. 5 and 6, the α ray dose of the light transmissive plate 28 is medium (0.0015 count/min $cm^2$), but the contents of potassium-based oxide are as large as 8 Wt %. However, since the α ray dose of the light transmissive plate 28 is relatively small, the white defect generation rate $T_f$ per produce after 1000 H and the normalized value can be fairly improved.

Further, in the sample No. 6, the doses of a rays emitted by the light transmissive plate 28 and the nonreflective films 29 and 30 have been controlled. In more detail, the α rays (109a) emitted by the light transmissive plate 28 are shaded perfectly by the non-reflective films 29 and 30, and in addition a part of the β rays (109c) emitted by the light transmissive plate 28 are shaded by the non-reflective films 29 and 30. Therefore, the addition of doses of the radioactive rays emitted by the light transmissive plate 28 and by the non-reflective films 29 and 30 in the sample No. 6 is smaller than that in the sample No. 5. Consequently the white defect generation rate $T_f$ per produce after 1000 H of the sample No. 6 is a half or less of that of the sample No. 5.

However, the normalized value of the white defect output value after 1000 H in the sample No. 6 is slightly higher than that of the sample No. 5. This may be due to the fact that the β rays increase by the influence of the dispersion in the contents of the K-based oxide in the light transmissive plate 28.

In the case of the sample No. 7, the α ray dose is small but the contents of the K-based oxide is large. As listed in Table 1, the normalized value and the white defect generation rate $T_f$ after 1000 H are almost the same as those of the sample Nos. 5 and 6. This reason is as follows: since the contents of the K-based oxide is large, the β rays may be decayed by [$^{40}K$], in the same way as with the case of the sample Nos. 5 and 6.

The sample Nos. 3 and 4 (examples 2 and 3) according to the present invention will be described hereinbelow. In the case of the sample No. 3, the non-reflective films 29 and 30 are not formed on the light transmissive plate 28, and in the case of the sample No. 4, the non-reflective films 29 and 30 are formed on the light transmissive plate 28. The α ray dose of the non-reflective films is about 0.001 count/min. $cm^2$).

Even in the case of the sample No. 3 having no non-reflective films, the white defect generation rate $T_f$ per produce after 1000 H isas extremely small as 0.15, which is almost the same value as that of the sample No. 6, as shown in FIG. 5.

Further, in the case of the sample No. 4 having the non-reflective film 30 on one surface of the light transmissive plate (as shown in FIG. 4) or the films 29 and 30 on both surfaces of the light transmissive plate (as shown in FIG. 2), it is possible to suppress the white defect generation rate $T_f$ and the normalized value after 1000 H, for the same reason as already explained with respect to the sample No. 4.

Further, in Table 1, although the normalized value of the sample 4 (Example 2) is roughly the same as that of the sample 6 (Reference 4), since the white defect generation rate $T_f$ is clearly different from each other, it is clear that the example 2 of this embodiment is advantageous.

As described above, in the solid-state image sensing device according to the present invention, since the light transmissive plate is formed of an optical glass (borosilicate glass) in which the contents of K(potassium)-based oxide is 0.1 or less Wt %, the deterioration in characteristics of the solid-state image sensing element due to radioactive rays can be prevent, thus it being possible to provide a solid-state image sensing device high in reliability, excellent in productivity and thereby low in manufacturing cost.

The present invention has been described with the embodiments of the solid-state image sensing device, and further the present invention can be applied to a semiconductor device in which the film made of borosilicate glass of the present invention is employed as a BPSG (Boro-Phosphosilicate Glass) film. By this application, software error caused by radioactive rays (α rays, in particular) can be prevented in the semiconductor devices such as EPROM.

What is claimed is:

1. A semiconductor device comprising:

a semiconductor element; and a film provided over the semiconductor element, the film containing borosilicate glass and potassium oxide, said potassium oxide being present in an amount of 0.1 weight percent or less.

2. A solid-state image sensing device, comprising:

an image sensing element; and a light transmissive plate provided over the image sensing element, the light transmissive plate containing borosilicate glass and potassium oxide, said potassium oxide being present in an amount of 0.1 weight percent or less.

3. A solid-state image sensing device as defined in claim 2, wherein the light transmissive plate is provided with, at least one non-reflective film attached to a surface of the light transmissive plate, such that the surface on which the non-reflective film is attached faces a light receiving surface of the image sensing element.

4. A solid-state image sensing device as defined in claim 2, wherein the non-reflective film is a single layer formed of a material selected from the group consisting of alumina, zirconia, tantalum oxide, and magnesium fluoride.

5. A solid-state image sensing device as defined in claim 2, wherein the non-reflective film is a multilayer formed of a material selected from the group consisting of alumina, zirconia, tantalum oxide, and magnesium fluoride.

* * * * *